United States Patent
Bangalore Umesh et al.

(10) Patent No.: US 11,492,699 B2
(45) Date of Patent: Nov. 8, 2022

(54) SUBSTRATE TEMPERATURE NON-UNIFORMITY REDUCTION OVER TARGET LIFE USING SPACING COMPENSATION

(71) Applicant: Applied Materials, Inc., Santa Clara, CA (US)

(72) Inventors: Suhas Bangalore Umesh, Sunnyvale, CA (US); Preetham Rao, Sunnyvale, CA (US); Shirish A. Pethe, Cupertino, CA (US); Fuhong Zhang, San Jose, CA (US); Kishor Kumar Kalathiparambil, Santa Clara, CA (US); Martin Lee Riker, Milpitas, CA (US); Lanlan Zhong, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/177,875

(22) Filed: Feb. 17, 2021

(65) Prior Publication Data

US 2022/0259720 A1 Aug. 18, 2022

(51) Int. Cl.
| | | |
|---|---|---|
| *C23C 14/50* | (2006.01) | |
| *C23C 14/54* | (2006.01) | |
| *C23C 14/34* | (2006.01) | |

(52) U.S. Cl.
CPC .......... *C23C 14/50* (2013.01); *C23C 14/3492* (2013.01); *C23C 14/54* (2013.01)

(58) Field of Classification Search
CPC ..... C23C 14/50; C23C 14/3492; C23C 14/54; H01L 21/76882
See application file for complete search history.

(56) References Cited

U.S. PATENT DOCUMENTS

| | | | |
|---|---|---|---|
| 6,280,585 B1 * | 8/2001 | Obinata ................ | C23C 14/345 204/298.12 |
| 6,416,635 B1 * | 7/2002 | Hurwitt .................. | C23C 14/54 204/192.12 |
| 2002/0144891 A1 | 10/2002 | Hurwitt et al. | |
| 2005/0051606 A1 * | 3/2005 | Perrot .................. | B23K 20/023 228/193 |
| 2005/0133361 A1 | 6/2005 | Ding et al. | |

(Continued)

FOREIGN PATENT DOCUMENTS

WO   WO 2011/077793 A1   6/2011

OTHER PUBLICATIONS

PCT International Search Report and Written Opinion for PCT/US2022/016486 dated May 23, 2022.

*Primary Examiner* — Jennifer Wecker
*Assistant Examiner* — Patrick S Ott
(74) *Attorney, Agent, or Firm* — Moser Taboada

(57) ABSTRACT

Methods and apparatus for processing a plurality of substrates are provided herein. In some embodiments, a method of processing a plurality of substrates in a physical vapor deposition (PVD) chamber includes: performing a series of reflow processes on a corresponding series of substrates over at least a portion of a life of a sputtering target disposed in the PVD chamber, wherein a substrate-to-target distance in the PVD chamber and a support-to-target distance within the PVD chamber are each controlled as a function of the life of the sputtering target.

18 Claims, 4 Drawing Sheets

(56) References Cited

U.S. PATENT DOCUMENTS

| | | |
|---|---|---|
| 2013/0055952 A1 | 3/2013 | Subramani et al. |
| 2013/0237053 A1* | 9/2013 | Ishizaka ............ H01L 21/76877 |
| | | 438/642 |
| 2013/0264035 A1* | 10/2013 | Goel ................ H01L 21/67115 |
| | | 165/135 |
| 2013/0270107 A1 | 10/2013 | Ewert et al. |
| 2015/0371847 A1 | 12/2015 | Cheng et al. |
| 2016/0056024 A1* | 2/2016 | Johanson .......... H01J 37/32733 |
| | | 204/192.12 |

* cited by examiner

300

302 — PERFORM A SERIES OF REFLOW PROCESSES ON A CORRESPONDING SERIES OF SUBSTRATES OVER AT LEAST A PORTION OF A LIFE OF A SPUTTERING TARGET DISPOSED IN THE PVD CHAMBER, WHEREIN A SUBSTRATE-TO-TARGET DISTANCE IN THE PVD CHAMBER AND A SUPPORT-TO-TARGET DISTANCE WITHIN THE PVD CHAMBER ARE EACH CONTROLLED AS A FUNCTION OF THE LIFE OF THE SPUTTERING TARGET

FIG. 3

SUBSTRATE TEMPERATURE NON-UNIFORMITY REDUCTION OVER TARGET LIFE USING SPACING COMPENSATION

FIELD

Embodiments of the present disclosure generally relate to substrate processing equipment.

BACKGROUND

A semiconductor device such as an IC (integrated circuit) generally has electronic circuit elements such as transistors, diodes, and resistors fabricated integrally on a single body of semiconductor material such as a wafer or substrate. The various circuit elements are connected through conductive connectors to form a complete circuit which can contain millions of individual circuit elements. Interconnects provide the electrical connections between the various electronic elements of an integrated circuit and form the connections between the circuit elements and the device's external contact elements, such as pins, for connecting the integrated circuit to other circuits. The interconnects may be constructed throughout multiple layers and connected within/between layers by trenches/vias. Reflow processes are often used as a method to fill in the trenches/vias.

The reflow process may be conducted in a physical vapor deposition (PVD) chamber having heating elements to facilitate performing the reflow process. The PVD chamber includes a target containing material to be sputtered onto substrates processed therein. In use, a substrate is placed in a lower, deposition position, during a deposition process and then raised to a higher, reflow position, during a reflow process. Over a lifetime of the target, target material may be sputtered onto chamber walls and other chamber components, changing a thermal profile of the PVD chamber. However, the change in thermal profile may lead to increased temperature non-uniformity across the substrate.

Accordingly, the inventors have provided improved methods and apparatus for improving temperature uniformity of substrates during a reflow process over a life of the target.

SUMMARY

Methods and apparatus for processing a plurality of substrates are provided herein. In some embodiments, a method of processing a plurality of substrates in a physical vapor deposition (PVD) chamber includes: performing a series of reflow processes on a corresponding series of substrates over at least a portion of a life of a sputtering target disposed in the PVD chamber, wherein a substrate-to-target distance in the PVD chamber and a support-to-target distance within the PVD chamber are each controlled as a function of the life of the sputtering target.

In some embodiments, a non-transitory computer readable medium having instructions stored thereon that, when executed by a processor, perform a method of processing a plurality of substrates in a physical vapor deposition (PVD) chamber that includes: performing a series of reflow processes on a corresponding series of substrates over at least a portion of a life of a sputtering target disposed in the PVD chamber, wherein a substrate-to-target distance in the PVD chamber and a support-to-target distance within the PVD chamber are each controlled as a function of the life of the sputtering target.

In some embodiments, a method of processing a plurality of substrates in a physical vapor deposition (PVD) chamber includes: while a sputtering target in the PVD chamber is at a first point in a life of the sputtering target, performing a reflow process on a first substrate disposed on a substrate support while the substrate is positioned at a first substrate-to-target distance in the PVD chamber and while the substrate support is at a first support-to-target distance; and while the sputtering target in the PVD chamber is at a subsequent second point in the life of the sputtering target, performing a reflow process on a second substrate while the substrate is positioned at a second substrate-to-target distance in the PVD chamber, different than the first substrate-to-target distance, and while the substrate support supporting the second substrate is at a second support-to-target distance, different than the first support-to-target distance, wherein a change between the first substrate-to-target distance and the second substrate-to-target distance and a change between the first support-to-target distance and the second support-to-target distance are both a function of the life of the sputtering target.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 3 depicts a method of processing substrates in a physical vapor deposition (PVD) chamber in accordance with some embodiments of the present disclosure.

Figure 1:
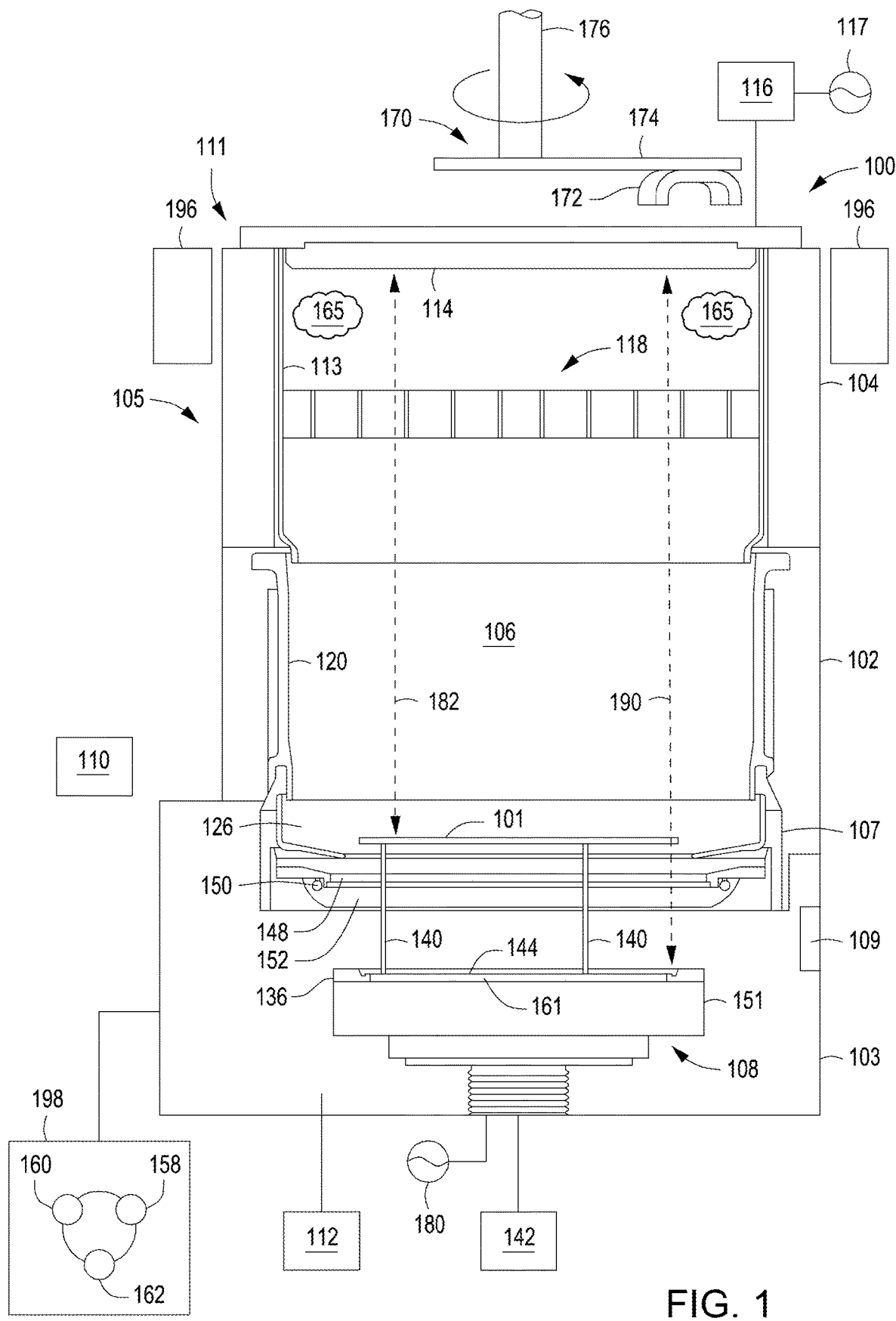
FIG. 1 depicts a schematic side view of a process chamber in a reflow position for a first substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for processing a plurality of substrates are provided herein. A substrate-to-heat source distance and support-to-heat source distance within a physical vapor deposition (PVD) chamber are controlled as a function of a life of a sputtering target. In some embodiments, the heat source is fixed within the PVD chamber. A sputtering target location may be used as a reference point to control the substrate-to-heat source distance and support-to-heat source distance. Hence, a substrate-to-target distance in the PVD chamber and a support-to-target distance within the PVD chamber are each controlled as a function of the life of the sputtering target.

The inventive methods and apparatus advantageously provide spacing compensation between a series of substrates and a target of a physical vapor deposition (PVD) chamber over a life of the target to improve substrate temperature uniformity during a series of reflow processes corresponding with the series of substrates. The inventive methods and apparatus advantageously provide spacing compensation between a substrate support of the PVD chamber and the target of the PVD chamber over a life of the target to improve substrate temperature uniformity during the series of reflow processes corresponding with the series of substrates.

FIG. 1 depicts a schematic side view of a process chamber in a reflow position for a first substrate in accordance with some embodiments of the present disclosure. Embodiments of the present disclosure are illustratively described herein with respect to a physical vapor deposition (PVD) chamber. However, the methods and apparatus of the present principles may be used in other process chambers as well. FIG. 1 depicts a PVD chamber (process chamber 100), e.g., a sputter process chamber, suitable for sputtering materials on a substrate 101 having a given diameter. In some embodiments, the process chamber 100 further includes a collimator 118 disposed therein. The process chamber 100 generally includes an upper sidewall 102, a lower sidewall 103, a ground adapter 104, and a lid assembly 111 defining a body 105 that encloses an interior volume 106. The interior volume 106 includes a central portion having approximately the given diameter of the substrate to be processed and a peripheral portion surrounding the central portion. In addition, the interior volume 106 includes an annular region above the substrate and proximate a sputtering target 114, wherein an inner diameter of the annular region is substantially equal to or greater than a diameter of the substrate 101 such that a predominant portion of a plasma 165 formed in the interior volume 106 during processing is disposed in a position both above and radially outward of the substrate.

An adapter plate 107 may be disposed between the upper sidewall 102 and the lower sidewall 103. A substrate support 108 is disposed in the interior volume 106 of the process chamber 100. The substrate support 108 may include, for example, an electrostatic chuck (ESC) 151 with a puck 161. The substrate support 108 is configured to support a substrate having a given diameter (e.g., 150 mm, 200 mm, 300 mm, 450 mm, or the like). A substrate transfer port 109 is formed in the lower sidewall 103 for transferring substrates into and out of the interior volume 106. In some embodiments, the process chamber 100 is configured to deposit, for example, cobalt (Co), copper (Cu), or aluminum (Al), alloys thereof, combinations thereof, or the like, on a substrate, such as the substrate 101. Non-limiting examples of suitable applications include metallic gap fill material deposition in vias, trenches, or structures, or the like.

A gas source 110 is coupled to the process chamber 100 to supply process gases into the interior volume 106. In some embodiments, process gases may include inert gases, non-reactive gases, and reactive gases, if necessary. Examples of process gases that may be provided by the gas source 110 include, but not limited to, argon (Ar), helium (He), krypton (Kr), neon (Ne), nitrogen ($N_2$), oxygen ($O_2$), and water ($H_2O$) vapor among others A pumping device 112 is coupled to the process chamber 100 in communication with the interior volume 106 to control the pressure of the interior volume 106. In some embodiments, the pumping device 112 may also be used to remove backside gases from the substrate 101 in order to minimize cooling down of the substrate 101. In some embodiments, during deposition the pressure level of the process chamber 100 may be maintained at approximately 1 Torr or less. In some embodiments, the pressure level of the process chamber 100 may be maintained at approximately 500 mTorr or less during deposition. In some embodiments, the pressure level of the process chamber 100 may be maintained at approximately 0.01 mTorr to approximately 300 mTorr during deposition.

The ground adapter 104 may support a target, such as sputtering target 114. The sputtering target 114 is fabricated from a material to be deposited on the substrate. In some embodiments, the sputtering target 114 may be fabricated from cobalt (Co), copper (Cu), or aluminum (Al), alloys thereof, combinations thereof, or the like. The sputtering target 114 may be coupled to a source assembly comprising a power supply 117 for the sputtering target 114. In some embodiments, the power supply 117 may be an RF power supply, which may be coupled to the sputtering target 114 via a match network 116. In some embodiments, the power supply 117 may alternatively be a DC power supply, in which case the match network 116 is omitted. In some embodiments, the power supply 117 may include both DC and RF power sources.

A magnetron 170 is positioned above the sputtering target 114. The magnetron 170 may include a plurality of magnets 172 supported by a base plate 174 connected to a shaft 176, which may be axially aligned with the central axis of the process chamber 100 and the substrate 101. The magnets 172 produce a magnetic field within the process chamber 100 near the front face of the sputtering target 114 to generate plasma so a significant flux of ions strike the sputtering target 114, causing sputter emission of target material. The magnets 172 may be rotated about the shaft 176 to increase uniformity of the magnetic field across the surface of the sputtering target 114. Examples of the magnetron include an electromagnetic linear magnetron, a serpentine magnetron, a spiral magnetron, a double-digitated magnetron, a rectangularized spiral magnetron, a dual motion magnetron, among others. The magnets 172 are rotated about the central axis of the process chamber 100 within an annular region extending between about the outer diameter of the substrate to about the outer diameter of the interior volume 106. In general, magnets 172 may be rotated such that the innermost magnet position during rotation of the magnets 172 is disposed above or outside of the diameter of the substrate being processed (e.g., the distance from the axis of rotation to the innermost position of the magnets 172 is equal to or greater than the diameter of the substrate being processed).

The process chamber 100 further includes an upper shield 113 and a lower shield 120. A collimator 118 is positioned in the interior volume 106 between the sputtering target 114 and the substrate support 108. In some embodiments, the collimator 118 may be electrically biased to control ion flux to the substrate and neutral angular distribution at the substrate, as well as to increase the deposition rate due to the added DC bias. Electrically biasing the collimator results in reduced ion loss to the collimator, advantageously providing greater ion/neutral ratios at the substrate. A collimator power source (not shown) is coupled to the collimator 118 to facilitate biasing of the collimator 118. In some embodiments, the collimator 118 may be electrically isolated from grounded chamber components such as the ground adapter 104. For example, as depicted in FIG. 1, the collimator 118 is coupled to the upper shield 113.

In some embodiments, a set of magnets 196 may be disposed adjacent to the ground adapter 104 to assist with generating the magnetic field to guide dislodged ions from the sputtering target 114. The magnetic field formed by the set of magnets 196 may alternatively or in combination prevent ions from hitting the sidewalls of the chamber (or sidewalls of the upper shield 113) and direct the ions vertically through the collimator 118. For example, the set of magnets 196 are configured to form a magnetic field having substantially vertical magnetic field lines in the peripheral portion. The substantially vertical magnetic field lines advantageously guide ions through the interior volume. The set of magnets 196 may include any combination of electromagnets and/or permanent magnets necessary to guide the metallic ions along a desired trajectory from the target, through the collimator, and toward the center of the substrate support 108. The set of magnets 196 may be stationary or moveable to adjust the position of a set of magnets in a direction parallel to a central axis of the chamber.

An RF power source 180 may be coupled to the process chamber 100 through the substrate support 108 to provide a bias power between the sputtering target 114 and the substrate support 108. In some embodiments, the RF power source 180 may have a frequency between approximately 400 Hz and approximately 200 MHz, such as approximately 13.56 MHz. In some embodiments, the RF power source 180 may provide greater than zero watts to approximately 1000 watts of bias power. In operation, the magnets 172 are rotated to form a plasma 165 in the annular portion of the interior volume 106 to sputter the sputtering target 114. The plasma 165 may be formed above the collimator 118, when the collimator 118 is present, to sputter the sputtering target 114 above the collimator 118. In some embodiments, the radius of rotation of the magnets 172 can be greater than the radius of the substrate 101 so that little to no sputtered material exists directly above the substrate 101.

In some embodiments, the collimator 118 is positively biased so that the metallic sputtered material is forced through the collimator 118. Moreover, most of the neutral sputtered material traveling toward the central region of the collimator will likely collide with and stick to the collimator walls. Because the directionality of the metallic neutrals cannot be changed, most of the metallic neutrals are advantageously not deposited on the substrate 101. To ensure that the trajectory of the sputtered metallic ions has enough space to be changed, the collimator 118 is disposed at a predetermined height above the substrate support 108. In some embodiments, the height is between approximately 400 mm to approximately 800. The height is also chosen to facilitate control of ions using the magnetic field beneath the collimator 118 to further improve deposition characteristics on the substrate 101. To enable modulation of the magnetic field above the collimator 118, the collimator 118 may be disposed at a predetermined height beneath the sputtering target 114. The height may be between approximately 25 mm to approximately 75 mm, for example, approximately 50 mm.

In some embodiments, the lower shield 120 may be provided in proximity to the collimator 118 and interior of the ground adapter 104 or the upper sidewall 102. The collimator 118 includes a plurality of apertures to direct gas and/or material flux within the interior volume 106. A shield ring 126 may be disposed in the process chamber 100 adjacent to the lower shield 120 and intermediate of the lower shield 120 and the adapter plate 107. The substrate 101 (shown supported on lift pins 140 in a reflow position) is centered relative to the longitudinal axis of the substrate support 108 by coordinated positioning calibration between the substrate support 108 and a robot blade (not shown). Thus, the substrate 101 may be centered within the process chamber 100 and the shield ring 126 may be centered radially about the substrate 101 during processing. The substrate 101 may alternatively be disposed on the substrate receiving surface 144 during the reflow process.

In operation, a robot blade (not shown) having the substrate 101 disposed thereon is extended through the substrate transfer port 109. The substrate support 108 may be lowered to allow the substrate 101 to be transferred to the lift pins 140 extending from the substrate support 108. Lifting and lowering of the substrate support 108 may be controlled by a drive 142 coupled to the substrate support 108. The substrate support 108 may be lowered as the lift pins 140 are raised to reach a heating or reflow position. Similarly, the substrate 101 may be lowered onto a substrate receiving surface 144 of the substrate support 108 by lowering the lift pins 140 and raising the substrate support 108 to a deposition position. With the substrate 101 positioned on the substrate receiving surface 144 of the substrate support 108, sputter deposition may be performed on the substrate 101. The deposition ring 136 may be electrically insulated from the substrate 101 during processing. Therefore, the substrate receiving surface 144 may include a height that is greater than a height of portions of the deposition ring 136 adjacent the substrate 101 such that the substrate 101 is prevented from contacting the deposition ring 136.

During the deposition process, material is sputtered from the sputtering target 114 and deposited on the surface of the substrate 101. The sputtering target 114 and the substrate support 108 are biased relative to each other by the power supply 117 or the RF power source 180 to maintain a plasma formed from the process gases supplied by the gas source 110. In some embodiments, the DC pulsed bias power applied to the collimator 118 also assists controlling ratio of the ions and neutrals passing through the collimator 118, advantageously enhancing the trench sidewall and bottom fill-up capability. The ions from the plasma are accelerated toward and strike the sputtering target 114, causing target material to be dislodged from the sputtering target 114. The dislodged target material and process gases forms a layer on the substrate 101 with desired compositions. The substrate 101 is then raised to a heating or reflow position and heated by a heat source, such as one or more lamps 150 during static reflow portions of the process. The one or more lamps 150 are then turned off, backside gases are pumped out using pumping device 112, and the substrate 101 is lowered to a processing or deposition position. The substrate 101 is then heated using RF bias power supplied by the RF power source 180 during the dynamic reflow portion of the process.

After sputter deposition, the substrate 101 may be elevated utilizing the lift pins 140 to a position that is spaced away from the substrate support 108. The elevated location may be above one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave portion 152 of the adapter plate 107. The one or more lamps 150 provide optical and/or radiant energy in the visible or near visible wavelengths, such as in the infrared (IR) and/or ultraviolet (UV) spectrum. The energy from the one or more lamps 150 is focused radially inward toward the backside (i.e., lower surface) of the substrate 101 to heat the substrate 101 and the material deposited thereon. Reflective surfaces on the chamber components surrounding the substrate 101 serve to focus the energy toward the backside of the substrate 101 and away from other chamber components where the energy would be lost and/or not utilized. After controlling the substrate 101 to a predetermined temperature, the substrate 101 is lowered to a position on the substrate receiving surface 144 of the substrate support 108. The substrate 101 may be removed from the process chamber 100 through the substrate transfer port 109 for further processing. The substrate 101 may be maintained at a predetermined temperature range, such as, but not limited to, less than 600 degrees Celsius.

The substrate 101 depicted in FIG. 1 may be a first substrate at a first point in the life of the sputtering target 114, such as at a beginning of the processing life of the sputtering target 114 (e.g., for a new sputtering target but after any burn-in operation). Once the first substrate is removed from the process chamber 100, a subsequent substrate is transferred into the process chamber 100 through the substrate transfer port 109. In some embodiments, a first substrate-to-target distance 182 at the first point in the life of the sputtering target 114 is about 600 mm to about 610 mm. In some embodiments, a first support-to-target distance 190 at the first point in the life of the sputtering target 114 is about 660 mm to about 680 mm. Over time, deposits from the sputtering target 114 deposit onto surfaces of chamber components exposed to the interior volume 106 leading to heat from the one or more lamps 150 to dissipate or reflect differently over a life of the sputtering target 114. The resultant change in the thermal profile of the interior volume 106 leads to increased temperature non-uniformity of the substrate 101 when in the reflow position. Changing the substrate-to-target distance and the support-to-target distance for reflow processing of subsequent substrates advantageously changes the substrate-to-heat source distance and the support-to-heat source distance and improves temperature uniformity of the subsequent substrates. For example, a temperature non-uniformity (NU) of about 15 degrees Celsius or lower may be achieved throughout the life of the target.

Figure 2:
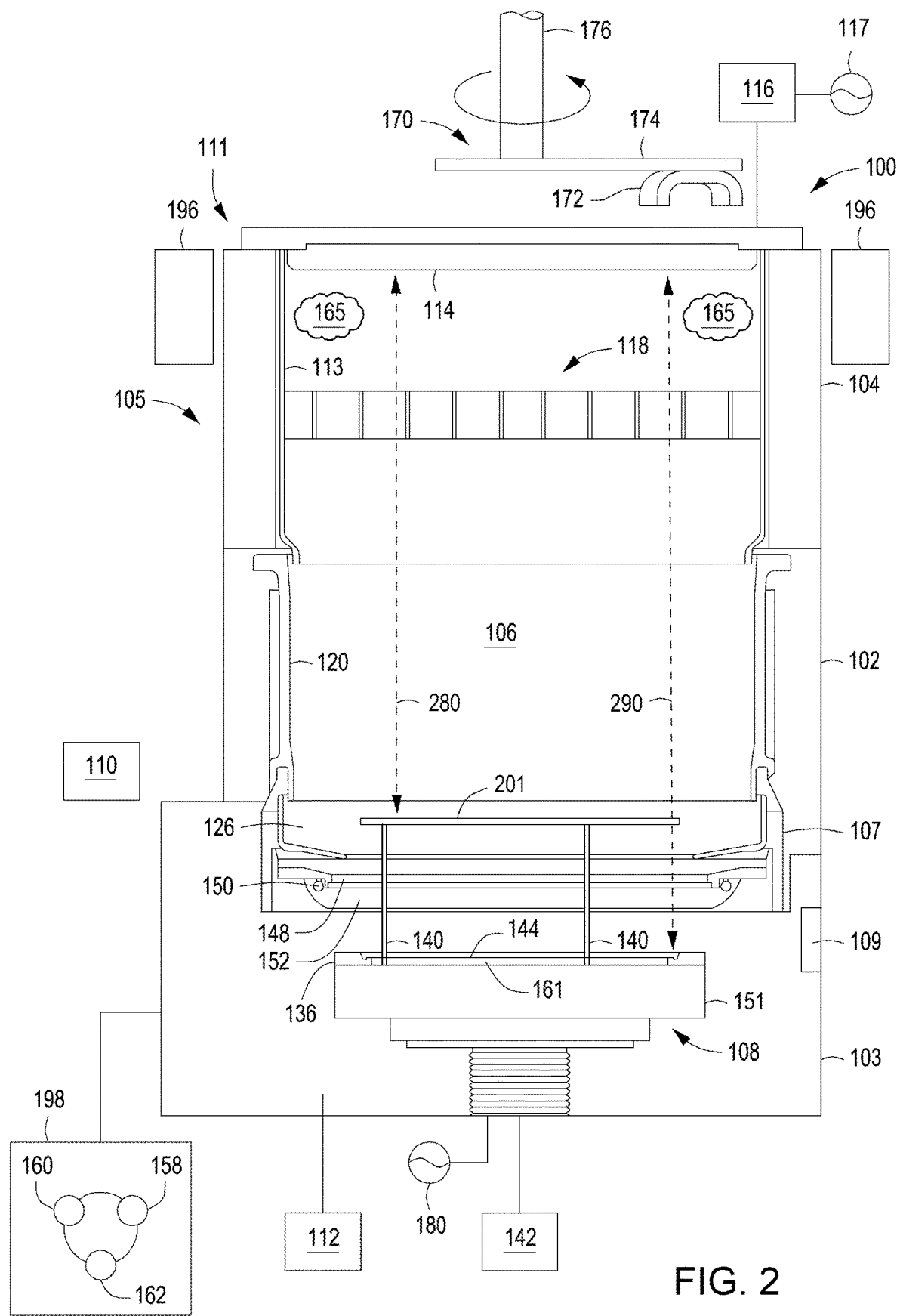
FIG. 2 depicts a schematic side view of a process chamber in a reflow position for a second substrate in accordance with some embodiments of the present disclosure.

FIG. 2 depicts a schematic side view of a process chamber in a reflow position for a subsequent substrate 201, for example, a second substrate, in accordance with some embodiments of the present disclosure. For the subsequent substrate 201, a substrate-to-target distance 280 is different than the first substrate-to-target distance 182. In some embodiments, for the subsequent substrate 201, a support-to-target distance 290 is different than the first support-to-target distance 190. In some embodiments, the substrate-to-target distance 280 at a point after the first point in the life of the sputtering target 114 is less than the first substrate-to-target distance 182. In some embodiments, the support-to-target distance 290 at a point after the first point in the life of the sputtering target 114 is less than the first support-to-target distance 190. In some embodiments, the substrate-to-target distance 280 at an end of the life of the sputtering target 114 is about 597 mm to about 602 mm. In some embodiments, the support-to-target distance 290 at an end of the life of the sputtering target 114 is about 662 mm to about 666 mm.

A controller 198 controls the operation of the process chamber 100 using a direct control of the process chamber 100, or alternatively, by controlling the computers (or controllers) associated with the process chamber 100. In operation, the controller 198 enables data collection and feedback from the process chamber 100 to optimize performance of the process chamber 100. The controller 198 generally includes a Central Processing Unit (CPU) 160, a memory 158, and a support circuit 162. The CPU 160 may be any form of a general-purpose computer processor that can be used in an industrial setting. The support circuit 162 is conventionally coupled to the CPU 160 and may comprise a cache, clock circuits, input/output subsystems, power supplies, and the like. Software routines, such as a method as described below may be stored in the memory 158 and, when executed by the CPU 160, transform the CPU 160 into a specific purpose computer (controller 198). The software routines may also be stored and/or executed by a second controller (not shown) that is located remotely from the process chamber 100.

The memory 158 is in the form of computer-readable storage media that contains instructions, when executed by the CPU 160, to facilitate the operation of the semiconductor processes and equipment. The instructions in the memory 158 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

FIG. 3 depicts a method 300 of processing a plurality of substrates in a physical vapor deposition (PVD) chamber. In some embodiments, the process chamber 100 of FIG. 1 and FIG. 2 may be employed to perform the method 300. At 302, the method 300 includes performing a series of reflow processes on a corresponding series of substrates (i.e., substrates 101) over at least a portion of a life of a sputtering target (i.e., sputtering target 114) disposed in the PVD chamber (i.e., process chamber 100), wherein a substrate-to-target distance in the PVD chamber and a support-to-target distance within the PVD chamber are each controlled (for example, via controller 198) as a function of the life of the sputtering target. In some embodiments, the corresponding series of substrates are elevated with respect to a substrate support (i.e., substrate support 108) when performing the series of reflow processes. The series of reflow processes on series of substrates may comprises reflow processes of cobalt (Co), copper (Cu), or aluminum (Al), alloys thereof, combinations thereof, or the like.

Figure 4:
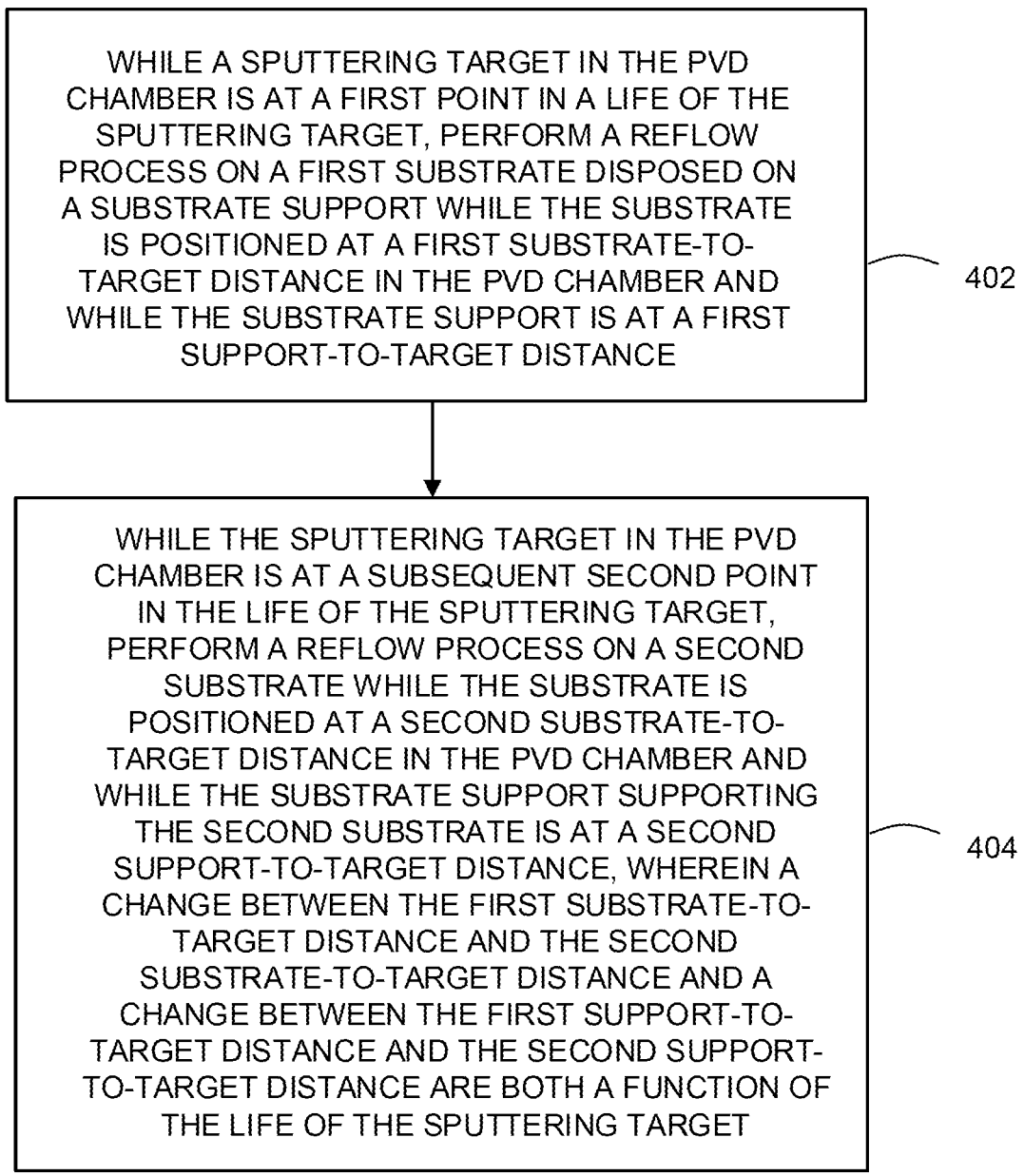
FIG. 4 depicts a method of processing substrates in a physical vapor deposition (PVD) chamber in accordance with some embodiments of the present disclosure.

FIG. 4 depicts a method 400 of processing substrates in a physical vapor deposition (PVD) chamber in accordance with some embodiments of the present disclosure. The method 400 may be an example of method 300. At 402, while the sputtering target in the PVD chamber is at a first point in a life of the sputtering target, a first reflow process of the series of reflow processes is performed on a first substrate disposed on the substrate support while the substrate is positioned at a first substrate-to-target distance (i.e., first substrate-to-target distance 182) in the PVD chamber and while the substrate support is at a first support-to-target distance (i.e., first support-to-target distance 190).

At 404, the method 400 includes while the sputtering target in the PVD chamber is at a subsequent second point in the life of the sputtering target, performing a reflow process on a second substrate while the substrate is positioned at a second substrate-to-target distance (i.e., second substrate-to-target distance 280) in the PVD chamber, different than the first substrate-to-target distance, and while the substrate support supporting the second substrate is at a second support-to-target distance (i.e., second support-to-target distance 290), different than the first support-to-target distance.

In some embodiments, the reflow processes on the first substrate and the second substrate are performed using one or more lamps (i.e., one or more lamps 150) disposed below the first substrate and the second substrate. In some embodiments, the first substrate and the second substrate are elevated via lift pins over the substrate support when performing the reflow process on the first substrate and the second substrate. In some embodiments, the substrates may rest on the substrate support when performing the respective reflow processes.

A change between the first substrate-to-target distance and the second substrate-to-target distance and a change between the first support-to-target distance and the second support-to-target distance are both a function of the life of the sputtering target. In some embodiments, the substrate-to-target distance may be changed at a first rate. In some embodiments, the support-to-target distance may be changed at a second rate. In some embodiments, at least one of the substrate-to-target distance and the support-to-target distance are controlled to change at a linear rate over the life of the sputtering target (i.e., at least one of the first rate and the second rate are linear). In some embodiments, at least one of the substrate-to-target distance and the support-to-target distance are controlled to change at a non-linear rate over the life of the sputtering target (i.e., at least one of the first rate and the second rate are non-linear).

A change of the substrate-to-target distance (i.e., first rate) and a change of the support-to-target distance (i.e., second rate) over the life of the sputtering target may depend on the target material or the substrate type, or both. In some embodiments, a change of the substrate-to-target distance is less than or equal to a change of the support-to-target distance over the life of the sputtering target. In some embodiments, the substrate-to-target distance is controlled to change about 0.002 mm to about 0.004 mm per every kilowatt-hour of the life of the sputtering target. In some embodiments, the support-to-target distance is controlled to change about 0.002 mm to about 0.006 mm per every kilowatt-hour of the life of the sputtering target. Specific rates of change of the substrate-to-target distance and the support-to-target distance for different target materials and/or different substrate types can be determined empirically or by modeling based upon the teachings disclosed herein.

In some embodiments, a first substrate-to-target distance at a first point in the life of the sputtering target (i.e., as depicted in FIG. 1) is about 600 mm to about 610 mm. In some embodiments, a first support-to-target distance at a first point in the life of the sputtering target is about 660 mm to about 680 mm. In some embodiments, a substrate-to-target distance at a target life of about 1000 kilowatt-hours (kWhr) after the first point in the life of the sputtering target is about 602 mm to about 606 mm. In some embodiments, a support-to-target distance at a target life of about 1000 kilowatt-hours (kWhr) after the first point in the life of the sputtering target is about 668 mm to about 672 mm. In some embodiments, the life of the sputtering target is about 2000 to about 3000 kilowatt-hours (kWhr).

In some embodiments, the plurality of substrates are positioned at a substrate-to-target distance that is constant during the reflow process of each substrate, and wherein a substrate support is positioned at a support-to-target distance that is constant during the reflow process of each substrate. For example, in any given reflow process, each substrate can be processed with a fixed substrate-to-target distance and a fixed support-to-target distance, but wherein the fixed substrate-to-target distance and fixed support-to-target distance varies from one substrate to the next (e.g., for different reflow processes) over the life of the target as discussed above. In some embodiments, the plurality of substrates are positioned at a substrate-to-target distance that varies during each reflow process, and wherein a substrate support is positioned at a support-to-target distance that varies during each reflow process. For example, the variation in the substrate-to-target distance and the support-to-target distance can occur during processing of individual substrates as well as between successive substrates.

While the foregoing is directed to embodiments of the present disclosure, other and further embodiments of the disclosure may be devised without departing from the basic scope thereof.

The invention claimed is:

1. A method of processing a plurality of substrates in a physical vapor deposition (PVD) chamber, comprising:
performing a series of reflow processes on a corresponding series of substrates over at least a portion of a life of a sputtering target disposed in the PVD chamber, wherein a substrate-to-target distance in the PVD chamber and a support-to-target distance within the PVD chamber are each independently controlled as a function of the life of the sputtering target, wherein a change of the substrate-to-target distance is less than a change of the support-to-target distance over the life of the sputtering target.

2. The method of claim 1, wherein at least one of:
a first substrate-to-target distance at a first point in the life of the sputtering target is about 600 mm to about 610 mm, or
a first support-to-target distance at a first point in the life of the sputtering target is about 660 mm to about 680 mm.

3. The method of claim 1, wherein the corresponding series of substrates are elevated with respect to a substrate support when performing the series of reflow processes.

4. The method of claim 1, wherein each substrate of the series of substrates is positioned at a substrate-to-target distance that is constant during a given reflow process, and wherein a substrate support is positioned at a support-to-target distance that is constant during the given reflow process.

5. The method of claim 1, wherein each substrate of the series of substrates is positioned at a substrate-to-target distance that varies during a given reflow process, and wherein a substrate support is positioned at a support-to-target distance that varies during the given reflow process.

6. The method of claim 1, wherein the life of the sputtering target is about 2000 to about 3000 kilowatt-hours (kWhr).

7. The method of claim 1, wherein at least one of:
the substrate-to-target distance is controlled to change about 0.002 mm to about 0.004 mm per every kilowatt-hour (kWhr) of the life of the sputtering target, or
the support-to-target distance is controlled to change about 0.002 mm to about 0.006 mm per every kilowatt-hour (kWhr) of the life of the sputtering target.

8. The method of claim 1, wherein the substrate-to-target distance and the support-to-target distance are controlled to change at a linear rate over the life of the sputtering target.

9. The method of claim 1, wherein the substrate-to-target distance and the support-to-target distance are controlled to change at a non-linear rate over the life of the sputtering target.

10. A non-transitory computer readable medium having instructions stored thereon that, when executed by a processor, perform the method of claim 1.

11. The computer readable medium of claim 10, wherein at least one of:
- a first substrate-to-target distance at a first point in the life of the sputtering target is about 600 mm to about 610 mm, or
- a first support-to-target distance at a first point in the life of the sputtering target is about 660 mm to about 680 mm.

12. The computer readable medium of claim 10, wherein each substrate of the series of substrates is positioned at a substrate-to-target distance that is constant during a given reflow process, and wherein a substrate support is positioned at a support-to-target distance that is constant during the given reflow process.

13. The computer readable medium of claim 10, wherein each substrate of the series of substrates is positioned at a substrate-to-target distance that varies during a given reflow process, and wherein a substrate support is positioned at a support-to-target distance that varies during the given reflow process.

14. A method of processing a plurality of substrates in a physical vapor deposition (PVD) chamber, comprising:
while a sputtering target in the PVD chamber is at a first point in a life of the sputtering target, performing a reflow process on a first substrate disposed on a substrate support while the substrate is positioned at a first substrate-to-target distance in the PVD chamber and while the substrate support is at a first support-to-target distance; and
while the sputtering target in the PVD chamber is at a subsequent second point in the life of the sputtering target, performing a reflow process on a second substrate while the substrate is positioned at a second substrate-to-target distance in the PVD chamber, different than the first substrate-to-target distance, and while the substrate support supporting the second substrate is at a second support-to-target distance, different than the first support-to-target distance, wherein a change between the first substrate-to-target distance and the second substrate-to-target distance and a change between the first support-to-target distance and the second support-to-target distance are both independently controlled as a function of the life of the sputtering target, and wherein a change of the substrate-to-target distance is less than a change of the support-to-target distance over the life of the sputtering target.

15. The method of claim 14, wherein the reflow process on the first substrate and the reflow process on the second substrate are performed using one or more lamps disposed below the first substrate and the second substrate.

16. The method of claim 14, wherein the first substrate and the second substrate are elevated via lift pins over the substrate support when performing the reflow process on the first substrate and the second substrate.

17. The method of claim 14, wherein the reflow process on the first substrate and the reflow process on the second substrate comprise reflow processes of cobalt (Co), copper (Cu), or aluminum (Al), alloys thereof, or combinations thereof.

18. The method of claim 14, wherein the second substrate-to-target distance is less than the first substrate-to-target distance, and the second support-to-target distance is less than the first support-to-target distance.

* * * * *